(12) United States Patent
Korngold et al.

(10) Patent No.: US 8,702,999 B2
(45) Date of Patent: *Apr. 22, 2014

(54) METHOD AND APPARATUS FOR PLASMA SURFACE TREATMENT OF A MOVING SUBSTRATE

(75) Inventors: Bruno Alexander Korngold, Drunen (NL); Hindrik Willem de Vries, Tilburg (NL); Eugen Aldea, Eindhoven (NL)

(73) Assignee: FujiFilm Manufacturing Europe B.V., Tilburg (NL)

( * ) Notice: Subject to any disclaimer, the term of this patent is extended or adjusted under 35 U.S.C. 154(b) by 574 days.

This patent is subject to a terminal disclaimer.

(21) Appl. No.: 12/865,710

(22) PCT Filed: Jan. 29, 2009

(86) PCT No.: PCT/NL2009/050041
§ 371 (c)(1),
(2), (4) Date: Nov. 5, 2010

(87) PCT Pub. No.: WO2009/096785
PCT Pub. Date: Aug. 6, 2009

(65) Prior Publication Data
US 2011/0042347 A1    Feb. 24, 2011

(30) Foreign Application Priority Data
Feb. 1, 2008    (EP) ..................... 08101192

(51) Int. Cl.
*B44C 1/22*    (2006.01)

(52) U.S. Cl.
USPC ............ 216/41; 216/63; 156/345.3; 427/569; 118/718; 118/721

(58) Field of Classification Search
USPC ................... 216/41, 63; 156/345.3; 427/569; 118/718, 721
See application file for complete search history.

(56) References Cited

U.S. PATENT DOCUMENTS 3,974,382 A * 8/1976 Bernacki .................. 378/34
4,478,878 A * 10/1984 Neuwald .................. 427/79

(Continued)

FOREIGN PATENT DOCUMENTS

DE    44 38 533 A1    5/1996
DE    10 2004 043 384 A1    3/2006

(Continued)

OTHER PUBLICATIONS

Lee, et al.—"Investigation of Silicon Oxide Thin Films Prepared by Atomic Layer Deposition using SiH2Cl2 and O3 as the Precursors"—Japanese Journal of Applied Physics, vol. 43, No. 3A, 2004, pp. L328-L330.

(Continued)

*Primary Examiner* — Lan Vinh
*Assistant Examiner* — Jiong-Ping Lu
(74) *Attorney, Agent, or Firm* — Gilberto M. Villacorta; Sunit Talapatra; Foley & Lardner LLP

(57) ABSTRACT

Method and plasma treatment apparatus for treatment of a substrate surface (1) using an atmospheric pressure plasma. An atmospheric pressure plasma is provided in a treatment space (5) between a first electrode (2) and a second electrode (3). Furthermore, a substrate (1) and a mask web (7) in contact with the substrate (1) are provided. A plasma generating power is applied to the first and second electrode (2, 3) for treatment of surface areas of the substrate (1) exposed by the mask web (7), in which the substrate (1) and mask web (7) are moved synchronously through the treatment space (5).

12 Claims, 2 Drawing Sheets

(56) References Cited

U.S. PATENT DOCUMENTS

| | | | |
|---|---|---|---|
| 4,631,199 A | 12/1986 | Hall et al. | |
| 4,681,780 A | 7/1987 | Kamman | |
| 5,166,870 A | 11/1992 | Shimizu et al. | |
| 5,187,457 A | 2/1993 | Chawla et al. | |
| 5,288,518 A | 2/1994 | Homma | |
| 5,422,584 A | 6/1995 | Waters | |
| 5,576,076 A | 11/1996 | Slootman et al. | |
| 5,660,744 A | 8/1997 | Sekine et al. | |
| 5,710,067 A | 1/1998 | Foote et al. | |
| 5,800,877 A | 9/1998 | Maeda et al. | |
| 6,159,559 A | 12/2000 | Reber et al. | |
| 6,413,645 B1 | 7/2002 | Graff et al. | |
| 6,464,779 B1 | 10/2002 | Powell et al. | |
| 6,534,421 B2 | 3/2003 | Kakkad | |
| 6,556,461 B1 | 4/2003 | Khersonsky et al. | |
| 6,613,394 B2 | 9/2003 | Kuckertz et al. | |
| 6,652,924 B2 | 11/2003 | Sherman | |
| 6,756,318 B2 | 6/2004 | Nguyen et al. | |
| 6,774,569 B2 | 8/2004 | De Vries et al. | |
| 6,835,425 B2 | 12/2004 | Fukuda et al. | |
| 6,861,334 B2 | 3/2005 | Raaijmakers et al. | |
| 6,955,836 B2 | 10/2005 | Kumagai et al. | |
| 7,098,131 B2 | 8/2006 | Kang et al. | |
| 7,298,072 B2 | 11/2007 | Czeremuszkin et al. | |
| 7,491,429 B2 | 2/2009 | De Vries et al. | |
| 7,533,628 B2 | 5/2009 | Bewig et al. | |
| 7,709,159 B2 | 5/2010 | Umetsu et al. | |
| 8,338,307 B2 * | 12/2012 | De Vries et al. | 438/706 |
| 2001/0000206 A1 | 4/2001 | Li et al. | |
| 2002/0011462 A1 | 1/2002 | Richter et al. | |
| 2002/0150839 A1 | 10/2002 | Peng | |
| 2003/0118748 A1 | 6/2003 | Kumagai et al. | |
| 2003/0152691 A1 * | 8/2003 | Baude et al. | 427/96 |
| 2003/0152849 A1 * | 8/2003 | Chan-Park et al. | 430/22 |
| 2004/0011764 A1 * | 1/2004 | De Vries et al. | 216/63 |
| 2004/0146660 A1 | 7/2004 | Goodwin et al. | |
| 2005/0020038 A1 * | 1/2005 | Mikhael et al. | 438/485 |
| 2005/0079418 A1 | 4/2005 | Kelley et al. | |
| 2005/0084610 A1 | 4/2005 | Selitser | |
| 2005/0085077 A1 | 4/2005 | Ogawa et al. | |
| 2005/0093458 A1 | 5/2005 | Babayan et al. | |
| 2005/0106986 A1 * | 5/2005 | Cok et al. | 445/58 |
| 2006/0231908 A1 | 10/2006 | Liu et al. | |
| 2007/0105389 A1 | 5/2007 | Narishige | |
| 2007/0273411 A1 | 11/2007 | Harris et al. | |
| 2008/0317974 A1 | 12/2008 | De Vries et al. | |
| 2009/0238997 A1 | 9/2009 | De Vries et al. | |
| 2009/0304949 A1 | 12/2009 | De Vries et al. | |
| 2009/0324971 A1 | 12/2009 | De Vries et al. | |
| 2010/0147794 A1 | 6/2010 | De Vries et al. | |
| 2011/0014424 A1 | 1/2011 | De Vries | |
| 2011/0049491 A1 | 3/2011 | De Vries et al. | |
| 2011/0089142 A1 | 4/2011 | Korngold et al. | |

FOREIGN PATENT DOCUMENTS

| | | | |
|---|---|---|---|
| EP | 0 889 506 A2 | 1/1999 | |
| EP | 1 340 838 A1 | 9/2003 | |
| EP | 1 351 321 A2 | 10/2003 | |
| EP | 1 381 257 A2 | 1/2004 | |
| EP | 1 383 359 A2 | 1/2004 | |
| EP | 1 403 902 A1 | 3/2004 | |
| EP | 1 029 702 B1 | 4/2004 | |
| EP | 1 548 795 A1 | 6/2005 | |
| EP | 1 626 613 A1 | 2/2006 | |
| EP | 1 750 294 A1 | 2/2007 | |
| EP | 1 371 752 B1 | 5/2008 | |
| JP | 58-111380 A | 7/1983 | |
| JP | 58-217344 A | 12/1983 | |
| JP | 62143480 A * | 6/1987 | H01L 31/04 |
| JP | 64-033932 A | 2/1989 | |
| JP | 04-094169 A | 3/1992 | |
| JP | 07-074110 A | 3/1995 | |
| JP | 2000-026632 A | 1/2000 | |
| JP | 2000-313962 A | 11/2000 | |
| JP | 2003-206361 A | 7/2003 | |
| JP | 2006-004740 A | 1/2006 | |
| WO | WO-99/04411 A1 | 1/1999 | |
| WO | WO-01/15220 A1 | 3/2001 | |
| WO | WO-01/69644 A1 | 9/2001 | |
| WO | WO-03/005461 A1 | 1/2003 | |
| WO | WO 2004/019381 A2 | 3/2004 | |
| WO | WO-2004/030019 A1 | 4/2004 | |
| WO | WO-2005/033189 A1 | 4/2005 | |
| WO | WO-2005/049228 A2 | 6/2005 | |
| WO | WO-2005/062337 A1 | 7/2005 | |
| WO | WO-2005/062338 A1 | 7/2005 | |
| WO | WO-2007/013703 A1 | 2/2007 | |
| WO | WO-2007/024134 A1 | 3/2007 | |
| WO | WO 2007/078556 A1 | 7/2007 | |
| WO | WO 2007/089146 A1 | 8/2007 | |
| WO | WO-2007/091891 A1 | 8/2007 | |
| WO | WO-2007/139379 A1 | 12/2007 | |
| WO | WO-2007/145513 A1 | 12/2007 | |
| WO | WO-2008/100139 A1 | 8/2008 | |
| WO | WO-2009/099325 A1 | 8/2009 | |
| WO | WO-2010/092384 A1 | 8/2010 | |

OTHER PUBLICATIONS

International Search Report mailed in May 11, 2009 received in International application No. PCT/NL2009/050041.

Affinito et al., "A new method for fabricating transparent barrier layers," Thin Solid Films, vols. 290-291, 1996, pp. 63-67.

Babayan et al., "Deposition of silicon dioxide films with an atmospheric-pressure plasma jet," Plasma Sources Sci. Technol., vol. 7, 1998, pp. 286-288.

Bletzinger et al., "The effect of displacement current on fast-pulsed dielectric barrier discharges," J Phys D Appl Phys, vol. 36, No. 13, 2003, pp. 550-1552.

Buss et al., "Synthesis of Silicon Nitride Particles in Pulse Radio Frequency Plasmas," J Vac Sci Technol.A, vol. 14, No. 2, 1996, pp. 577-581 [XP-002391555].

Gherardi et al., "A new approach to SiO2 deposit using a N2—SiH4—N2O glow dielectric barrier-controlled discharge at atmospheric pressure," J.phys. D: Appl. Phys., vol. 33, 2000, pp. L104-L108.

Martin et al., "Atmospheric pressure PE-CVD of silicon based coatings using a glow dielectric barrier discharge," Surface and Coatings Technology, 177-178, 2004, pp. 693-698.

Watanabe et al., "Formation Kinetics and Control of Dust Particles in Capacitively-Coupled Reactive Plasmas," Physica Scripta, vol. T89, 2001, pp. 29-32 [XP008066859].

Kanazawa et al., "Glow Plasma Treatment at Atmospheric Pressure for Surface Modification and Film Deposition," Nuclear Instruments and Methods in Physics Research, Feb. 1989, vols. 37-38, Beam Interactions with Materials and Atoms, pp. 842-845.

Office Action in U.S. Appl. No. 12/304,614 dated Oct. 16, 2012.

* cited by examiner

METHOD AND APPARATUS FOR PLASMA SURFACE TREATMENT OF A MOVING SUBSTRATE

This is a National Stage application of PCT/NL2009/050041, filed Jan. 29, 2009, which claims priority to Europe Patent Application No. 08101192.6, filed Feb. 1, 2008. The foregoing application is incorporated by reference herein in its entirety.

FIELD OF THE INVENTION

The present invention relates to a method for treatment of a substrate surface using an atmospheric pressure plasma, the method comprising providing an atmospheric pressure plasma in a treatment space between a first electrode and a second electrode, providing a substrate and a mask web in contact with the substrate, and applying a plasma generating power to the first and second electrode for treatment of surface areas of the substrate exposed by the mask web. In a further aspect, the present invention relates to a plasma treatment apparatus for treatment of a surface of a substrate, comprising a discharge electrode structure having a treatment space and comprising a first electrode and a second electrode, a power supply connected to the first electrode and the second electrode for generating an atmospheric pressure plasma in the treatment space, and a transport installation for transporting the substrate through the treatment space.

PRIOR ART

International patent publication WO2004/019381 describes the process of depositing a coating on a substrate in the form of a moving web. A rotating drum is used as one of the electrodes for generating a glow discharge plasma.

European patent publication EP 1 403 902 A1 discloses a method for generating an atmospheric pressure glow discharge plasma using a dielectric barrier discharge electrode configuration. A drum shaped electrode is used, and the substrate film to be treated is guided along a part of the circumference of the drum shaped electrode.

SUMMARY OF THE INVENTION

The present invention seeks to provide an improved substrate treatment method and apparatus, which allow a substrate surface to be patterned in a continuous manner using an atmospheric pressure plasma.

According to the present invention, a method according to the preamble defined above is provided, in which the substrate and mask web are moved synchronously through the treatment space. This allows to efficiently perform a plasma treatment of a substrate in the form of a moving substrate or a moving web in a continuous manner, such as in roll-to-roll treatment of webs.

In a further embodiment, the mask web is electrically conductive. This is advantageous in combination with the generated plasma for providing an optimum result (well defined plasma, and well defined mask openings to expose parts of the substrate). Depending on the specific application, the mask web may be grounded, at floating potential or at the same potential as the first electrode.

As mentioned above, the substrate may be a roll to roll substrate, e.g. in the form of a polymer web. Many materials used in various applications as basic material are provided as a roll-to-roll substrate. Using the present method, these may efficiently be plasma treated to obtain a semi-product for further production into a final product.

To obtain an optimal defined pattern on the substrate, the mask web is a roll to roll mask web in a further embodiment. This allows to synchronize the movement of both substrate and mask to obtain as low as possible shifts between substrate and mask during treatment. In a further embodiment, the mask web is a continuous mask web, (endless mask, loop of material), allowing to re-use pattern areas of the mask continuously.

In a further embodiment, the mask web is held in contact with the web by a magnetic force. This furthermore aids in maintaining the mask web and substrate in close contact, resulting in better defined structures on the substrate after treatment.

The method, in a further embodiment, further comprises depositing a material on the treated substrate. E.g., the material is an ink selected from the group consisting of a water based ink, a conductive ink, a gel based ink. Using the present method embodiments, a substrate may be treated with a mask with very fine details, after which material may be deposited using the changed characteristics of the substrate after treatment. For ink treatment, e.g. use can be made of hydrophobic/hydrophilic areas on the treated substrate.

In a further aspect, the present invention relates to a plasma treatment apparatus according to the preamble defined above, in which the first electrode is arranged to receive, in operation, the substrate to be treated and a mask web in contact with the substrate, in which the transport installation is arranged to move the substrate and the mask web synchronously through the treatment space. This apparatus is suitable for implementing the method according to the various embodiments of the present invention. E.g. in further apparatus embodiments, the transport installation comprises a roll to roll assembly for the substrate, and/or the transport installation comprises an endless web assembly for the mask web. Furthermore, the transport installation may comprise a control unit for controlling the speed of the substrate and the speed of the mask web in the treatment space. Even further, the web mask comprises a paramagnetic material and the plasma treatment apparatus further comprises a magnetic layer provided in the first electrode, in order to obtain close contact between mask and substrate. For this, e.g., the mask web has a magnetic permeability of at least 1 Tm/A, e.g. equal to or larger than 5 Tm/A.

In even further aspects, the present invention also relates to use of the method according to any one of the present embodiments for providing a surface of a substrate with a predefined pattern, or to use of the method according to the present embodiments for providing a hydrophobic substrate with a predefined hydrophilic pattern. Sharp defined transitions may e.g. be provided between hydrophobic and hydrophilic areas of the substrate, in which a transition length is less than 10 microns, e.g. less than 2 micron or even less than 0.2 micron. Furthermore, the present invention relates to use of the method according to any of the present embodiments for etching a surface of a substrate with a predefined pattern, or to the use of the method according to any of the present embodiments for depositing material in a predefined pattern on a surface of a substrate.

SHORT DESCRIPTION OF DRAWINGS

The present invention will be discussed in more detail below, using a number of exemplary embodiments, with reference to the attached drawings, in which FIG. 1 shows a schematic diagram of an embodiment of a plasma treatment apparatus according to the present invention;

DETAILED DESCRIPTION OF EXEMPLARY EMBODIMENTS

Figure 1:
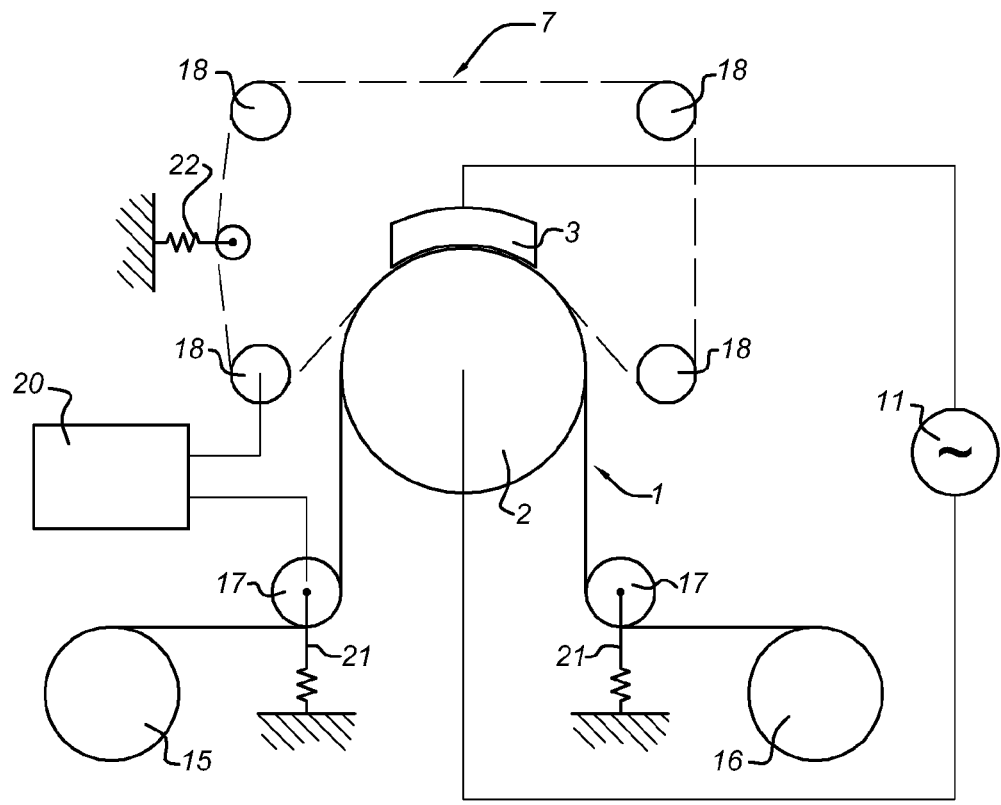

In FIG. 1 a schematic embodiment is shown of a plasma treatment apparatus for the treatment of a substrate 1 in the form of e.g. a polymeric web. The substrate 1 is a long web, which is transported from a first roll 15 to a second roll 16, e.g. using intermediate rollers 17 to keep the substrate 1 under tension.

The plasma is generated using two electrodes 2, 3 in a dielectric barrier discharge (DBD) configuration, which as such is known to the skilled person. In this embodiment, a first electrode 2 has the form of a cylinder electrode connected to a plasma generation unit 11. A second electrode 3 is formed by a flat curved electrode following the curvature of the cylindrical surface of the first electrode 2 at a predetermined distance, which also is connected to the plasma generation unit 11. The width of the second electrode 3 substantially corresponds to the width of the web 1 to be treated, or is somewhat wider.

A mask web 7 is also put in motion, synchronous with the movement of the web 1, and is brought into contact with the web 1 on the first electrode 2, just before entering the treatment space 5 between electrodes 2, 3. As a result, two different materials are transported over the drum shaped first electrode 2, e.g. a polymeric film as substrate or web 1, covered by a metallic mask web 7. This allows the use of a (flexible) mask web 7 to pattern the surface of the web 1 in a continuous roll to roll mode. By having the substrate 1 and mask web 7 to move synchronously, damage to the substrate 1 is prevented.

The mask web in this embodiment is an endless loop, running over rollers 18. An additional tensioning unit 22 may also be included in the pathway of the mask web 7 in order to make sure a sufficient high tension is maintained in the mask web 7.

In a further embodiment, the mask web 7 may be of finite dimension, and may, like the web 1, be transported from a first to a second roll to hold the mask web 7.

The transport of the substrate 1 and the mask web 7 through the treatment space 5 is implemented by a transport installation, comprising various parts. In the embodiment shown in FIG. 1, the transport installation comprises the rollers 18 for the mask web 7, and the first, second and intermediate rollers 15, 16, 17 for the substrate 1. Other embodiments and constituents of the transport installation are possible.

In order to maintain a synchronous movement of web 1 and mask web 7 in the treatment space 5 between electrodes 2, 3, the system may also comprise a web control unit 20, which is connected to at least one of the rollers 17 in the pathway of the web 1, and at least one of the rollers 18 in the pathway of the mask web 7, for driving the rollers 17, 18 (e.g. using an internal or external drive device such as an electric motor). These rollers 17, 18 may also be provided with sensors measuring the speed of the web 1 and mask web 7, respectively, which feed back these signals to the web control unit 20. As a result it is possible to ensure that the web 1 and the mask web 7 have the same line speed in the treatment space 5 between first and second electrode 2, 3, as a result of which any possible scratching of the web 1 is prevented.

The plasma control unit 11 e.g. comprises a power supply and associated control circuitry as described in the pending international patent application PCT/NL2006/050209, and European patent applications EP-A-1381257, EP-A-1626613 of applicant, which are herein incorporated by reference. The mask device 7 can be either on a floating potential, be grounded, or be on the same potential as the first (bottom) electrode 2. Depending on the type of material used for the mask device 7 and the substrate 1, and the type of application, these alternatives may provide an optimum result.

The plasma generation unit 11 is arranged to generate a uniform atmospheric pressure glow discharge plasma in the treatment space 5 between first and second electrode 2, 3. With this APG plasma, the parts of the surface of the web 1 may be treated which are exposed by the metallic mask web 7. This may e.g. be applied in the manufacturing of printed electronics as one of the processing steps, e.g. to make parts of the surface of the web 1 hydrophilic or hydrophobic. Also, with appropriate gas supply means, the local plasma in the treatment space 5 may be used to deposit substances on the exposed parts of the surface of the web 1.

Using the APG plasma, the treatment space 5 may be supplied with various gasses and compounds. These include, but are not limited to $N_2$, $NH_3$, $O_2$, $CO_2$ for hydrophilic treatment of a substrate 1, or $CF_4/H_2$ or plasma polymerized HMDSO (ppHMDSO) for hydrophobic treatment of a substrate 1.

Although the embodiment described above mentions the use of a DBD electrode structure for generating an atmospheric pressure glow discharge plasma, any plasma may be used to treat the surface of the web 1 as desired, e.g. using an inductively coupled plasma (ICP) generation.

In a further embodiment, a better contact between web 1 and mask web 7 is ensured by using magnetic forces. For this, the first electrode 2 is provided with a magnetized layer 6, as e.g. shown in the schematic diagram of FIG. 2, in which the area of the treatment space 5 (including first and second electrode 2, 3) is shown straightened. This is specifically advantageous when the patterns in the mask web 7 are complicated and may tend to lift off from the polymeric web 1.

The DBD structure of the apparatus according to FIG. 1 is enhanced by using a further dielectric barrier 4 on the surface of the second electrode 3 directed towards the treatment space 5. This will enhance the generation of a stable plasma in the treatment space 5 and may help in providing a stable and uniform glow discharge plasma in case this is needed.

In an embodiment, the mask web 7 is used on top of the surface of web 1, which in its turn is positioned on top of a magnetic layer 6, which interacts with the mask web 7. The mask web 7 may be made of conductive material, e.g. a metal mask web 7. To secure intimate contact between mask web 7 and the surface of web 1, the mask web 7, which has a predetermined magnetic permeability, can be held in close contact with the web 1 using the magnetic layer 6. For the best results, there is basically no space between the mask web 7 and the web 1, and if there would be a space at all, the distance between mask web 7 and web 1 should be e.g. less than 1 micrometer. The material to be treated (surface of web 1) is sandwiched between the mask web 7 and magnetic layer 6. Main advantages are that the bulk plasma ignites at normal low breakdown voltages and the gas supply to the holes 10 in the mask device 7 towards the surface of the web 1 is by diffusion from the bulk plasma in treatment space 5.

The magnetic layer 6 is positioned on top of the first electrode 2, e.g. in the form of a magnetic layer 6. As an alternative, the magnetic layer 6 is arranged as part of the first electrode 2. The mask web 7 is made of a thin material, in which a pattern is provided as holes or openings 10 in the material for patterning the surface of the web 1. As a result, the web 1 is sandwiched between the mask web 7 and the magnetic layer 6.

Figure 2:
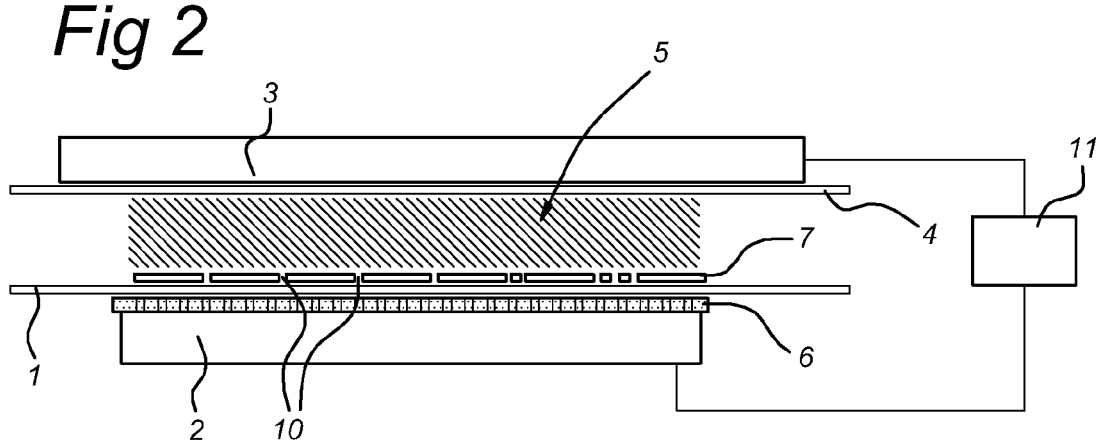
FIG. 2 shows a schematic diagram of a further embodiment according to the present invention, illustrating details of a straightened electrode section in which a mask is held to a substrate using magnetic forces.

In one embodiment, the magnetic layer 6 e.g. comprises small line shaped alternating north and south poles as shown in the cross sectional view of FIG. 2 which have good interaction with the mask device 7. The magnetic layer 6 can either be conductive or non-conductive. In an example, a magnetic layer 6 was used obtainable from Bakker Magnetics, available under the name 'Natural Magnetic foil', which comprises a semi-anisotropic magnetic layer. This flexible foil comprises alternating magnetic poles at a predefined pitch distance (see e.g. the embodiment shown in FIG. 2) Also other flexible magnetic layers from other suppliers may be used. In another magnetic layer 6 which may be used, the magnetic layer e.g. comprises randomly oriented alternating magnetic poles. The thickness of the foil 6 used is as low as possible in order not to interfere with the generation of the glow discharge plasma in the treatment space 5. The thickness of the magnetic layer 6 is e.g. less than 1 mm, e.g. 0.75 or 0.5 mm In another embodiment also foils 6 may be used with a thickness of more than 1 mm, for example 1.5 or 2 mm or even more. The magnetic layers 6 suitable for use in this invention have as a fundamental property, that the magnetic field extends through the web 1 into the mask web 7 to allow a sufficiently strong attraction force. In order to have this sufficient attractive force the magnetic force should be evenly distributed over the surface of the magnetic layer 6 and exerts a magnetic force of between 5 and 100 g/cm$^2$, e.g. 19 or 41 g/cm$^2$. A higher magnetic force will allow to use a thinner mask web 7 (less material to attract).

The mask web 7 is made of a material which may have a magnetic permeability of at least 1 Tm/A, e.g. equal to or larger than 5 Tm/A. Very good results are obtained with the mask device having a magnetic permeability of 100, or 500 or 1000 Tm/A or any value in between. Material having such magnetic permeability can be selected from ferromagnetic material, or martensitic or austenitic material having ferromagnetic properties. It is furthermore known, that the attraction between a magnetic material and a material attractive for magnetic force is dependant on the thickness of an intermediate layer (i.e. the web 1) and the mask web 7. In further embodiments, the thickness of the mask web 7 is chosen as small as possible in order to have a good interaction with the magnetic layer 6 and as little as possible interference with the generation of the plasma in the treatment space 5. For this, the thickness of the mask web 7 is less than 1 mm, e.g. less than 0.4 mm, e.g. 0.1 or 0.05 mm.

In an embodiment where a glow discharge plasma may be used advantageously the formation of a glow discharge plasma may be stimulated by controlling the displacement current using a plasma control unit 11 connected to the electrodes 2, 3 (see FIGS. 1 and 2), and by controlling the distance between electrodes 2, 3, the glow discharge plasma formation can be promoted even into the small holes 10 in the mask device 7, leading to a uniform activation of the (unmasked) surface of substrate 1.

EXAMPLE(S)

A cyclic olefin polymer (COP) substrate roll 1 (optical grade Topas 0.1 mm thick and 17.8 cm width) was used in the surface treatment line as shown in FIG. 1 to pattern small hydrophilic spots. The total working length of the plasma discharge in the treatment space 5 is typically 20 cm.

A flexible mask 7 (open squares with a pitch distance of 0.4 mm) 0.10 mm thick and 18 cm width (AISI 301) was brought as an endless loop in the line as shown in FIG. 1 and run with a line speed of 1.0 m/min. The pitch distance is defined as the distance from the centre point of each square to its direct neighbour square centre point Gas mixture of Ar 8 slm, N$_2$ 2 slm and O$_2$ 0.5 slm was used. The sine pulse period applied was 200 micro seconds. Excitation frequency of the plasma was typically 140 kHz. In order to control the stability of the APG plasma in the treatment space a displacement current control was applied (dynamic matching).

The water contact angle (WCA) was measured using a Krüss DSA 10 Micron contact angle meter, dispensing droplets of 50 μl. First the quality of the plasma surface treatment was classified on COP substrate without using a moving mask according to the reproducibility of the spot to spot treatment, judging in total 10 spots per treated sample. The effective treatment time in the treatment space was influenced by varying the duty cycles (DC). Less than 5% average WCA variation was judged as good (○), more than 5% (Δ) as moderate and more than 20% as bad (X). Table 1 shows its result and points out that at least a duty cycle of 2% is needed and preferably above 10% in order to give an effective plasma treatment.

TABLE 1

Relation DC and effective treatment time on COP substrate

| DC % | Δt [s] | Classification Ar/N2 |
|---|---|---|
| 1 | 0.12 | Δ |
| 2 | 0.24 | Δ |
| 10 | 1.2 | ○ |
| 20 | 2.4 | ○ |
| 40 | 4.8 | ○ |

Non treated COP has a typical WCA of 110°. After treatment the hydrophilicity has increased dramatically.

Figure 3:
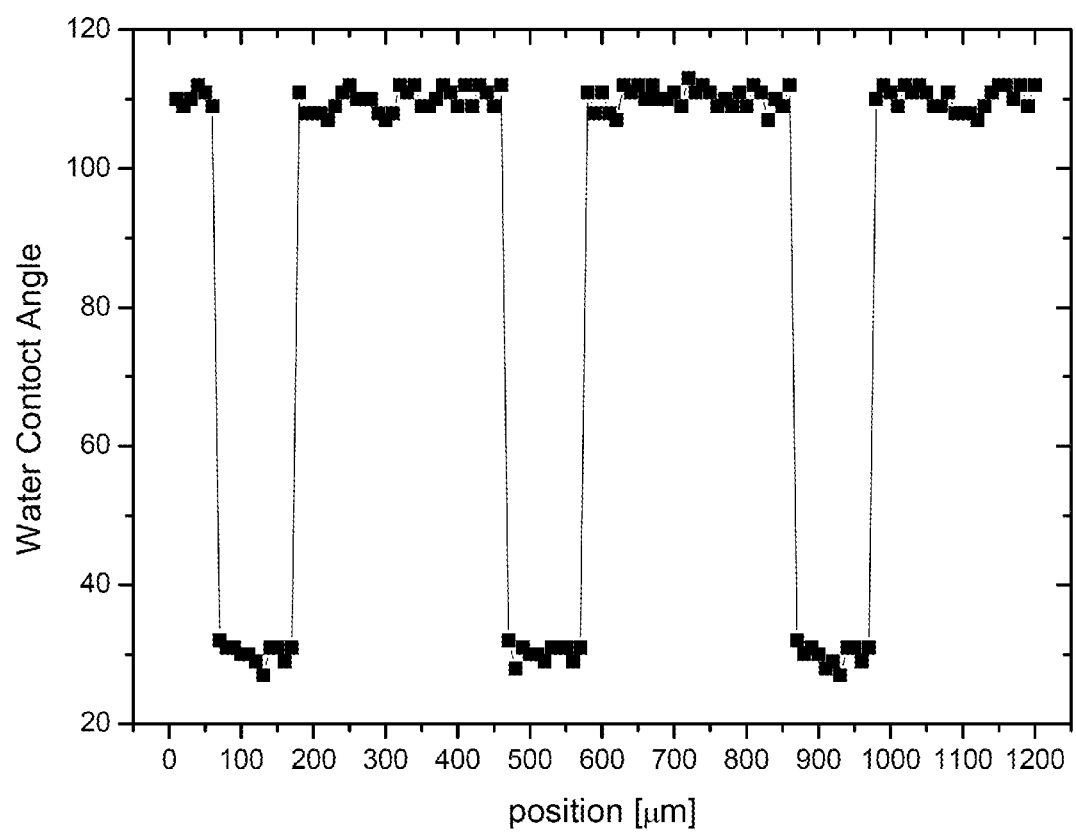
FIG. 3 shows a graph of a measurement of a water contact angle of a substrate treated using the present invention embodiments.

FIG. 3 is showing a typical example of a WCA scan across a COP substrate 1 in the moving web direction treated by the plasma patterning process using a moving mask 7 with a line speed of mask and COP substrate of 1 m/min at a 20% duty cycle. Similar results were obtained using CO$_2$, and H$_2$ instead of O$_2$ as a mixing gas using a plasma treatment at 20% duty cycle.

It is clear from FIG. 3 that it is possible to realize patterns with predefined structures of hydrophobic/hydrophilic areas (or vice versa) and sharp transitions between hydrophilic and hydrophobic area (or vice versa) on substrates by this invention which may be very useful in applications such as micro titer plates manufacturing, electrically conductive paths manufacturing and even transparent conductive patterns manufacturing on substrates. In these applications, materials are deposited on the treated substrate, and adherence or reaction of the deposited material is defined by the hydrophobic/hydrophilic areas. In other applications, the treatment of the surface may further comprise etching the substrate 1, wherein the etching activity is determined by the treated/untreated areas of the substrate 1.

In order to quantitatively describe the sharp transition from hydrophilic to hydrophobic or vice versa we have defined a parameter which characterises how sudden the wettability transition η "happens".

$$\eta = \left| \frac{WCA(x_2) - WCA(x_1)}{x_2 - x_1} \right| \; [°/\mu m]$$

Where x2 and x1 represent the position of the droplets deposited at the border of the surface energy well. Difficulty is that the droplet cannot be deposited on the corner because the droplet will then move in to the surface energy well.

From FIG. 3 an $\eta = 8°/\mu m$ can be derived, which indicates that sharp transitions between the hydrophilic to hydrophobic area (or vice versa) can be achieved smaller than 10 micron. To obtain even more detailed information about the typical sharpness of the wettability transition more detailed analysis measurements were carried out with the micro contact angle equipment using 10 μl droplets taking intervals as small as 1 μm. Based on these measurements an $\eta = 50 \; \mu m$ is observed, which indicates the transition between the hydrophilic to hydrophobic area (or vice versa) are very sharp and even smaller than 2 micron, e.g. smaller 0.2 micron.

Especially the invention can be used in the application of inkjet printing. Although the inkjet printing nozzle may have a less accurate output the invented method allows to control the hydrophobic/hydrophilic surface parts very accurately in lateral scale. The liquid ink dispensed by the nozzle will automatically move to area of highest surface energy.

Materials which also may be used to coat the COP substrate are commercially available conductive inks containing for instance containing silver-particles. Also, gel-based inks based on transparent conductive material can be used. The sol-gel will adhere only to those areas of the substrate 1 which are hydrophilic. Subsequently, the transparent conductive sol gel can be cured by a temperature step or by UV curing. In this manner, a patterned transparent layout can be printed on a polymer surface, which may be used for display applications, or photovoltaic cells.

The invented method can be used in other printing applications too like for instance offset printing.

The invention claimed is:

1. A method for treatment of a substrate surface, comprising:
   (a) providing an atmospheric pressure plasma in a treatment space between a first electrode and a second electrode,
   (b) providing the substrate in contact with a magnetic layer that is either disposed on or part of the first electrode, and an electrically conductive mask web in contact with the substrate, and
   (c) applying a plasma generating power to the first and second electrode for treatment of the substrate surface exposed by the mask web,
   in which the substrate and mask web are moved synchronously through the treatment space; and
   in which the substrate is a roll to roll substrate.

2. The method according to claim 1, in which the mask web is a roll to roll mask web.

3. The method according to claim 1, in which the mask web is a continuous mask web.

4. The method according to claim 1, in which the mask web is held in contact with the substrate by magnetic force.

5. The method according to claim 1, in which the method further comprises depositing a material on the treated substrate.

6. The method according to claim 5, in which the material is an ink selected from the group consisting of water based ink, conductive ink, and gel based ink.

7. The method of claim 1, wherein the mask web has at magnetic permeability of at least 1 Tm/A.

8. A method of providing a surface of a substrate with a predefined pattern, the method comprising:
   (a) providing an atmospheric pressure plasma in a treatment space between a first electrode and a second electrode,
   (b) providing the substrate in contact with a magnetic layer that is either disposed on or part of the first electrode, and an electrically conductive mask web in contact with the substrate, and
   (c) applying a plasma generating power to the first and second electrode for etching of the substrate surface exposed by the mask web,
   in which the substrate and mask web are moved synchronously through the treatment space; and
   in which the substrate is a roll to roll substrate.

9. The method of claim 8, in which the substrate is a hydrophobic substrate.

10. The method according claim 9, in which the predefined pattern comprises sharp defined transitions between hydrophobic and hydrophilic areas of the substrate, and in which a transition length is less than 10 microns.

11. The method according to claim 10, in which the transition length is less than 2 micron.

12. The method according to claim 11, in which the transition length is less than 0.2 micron.

* * * * *